(12) United States Patent
Calafut

(10) Patent No.: US 6,229,163 B1
(45) Date of Patent: May 8, 2001

(54) VERY HIGH ASPECT RATIO SEMICONDUCTOR DEVICES USING FRACTAL BASED TOPOLOGIES

(75) Inventor: Daniel S. Calafut, San Jose, CA (US)

(73) Assignee: Fairchild Semiconductor Corp., South Portland, ME (US)

( * ) Notice: Subject to any disclaimer, the term of this patent is extended or adjusted under 35 U.S.C. 154(b) by 0 days.

(21) Appl. No.: 09/197,099

(22) Filed: Nov. 20, 1998

(51) Int. Cl.[7] .......................... H01L 27/48; H01L 29/768
(52) U.S. Cl. .......................... 257/242; 257/392; 257/401; 257/923
(58) Field of Search .................... 438/942, 514, 438/517, 197; 257/202, 213, 240, 335, 337, 340, 368, 394, 404, 341, 342, 210, 242, 329, 401, 403, 923

(56) References Cited

U.S. PATENT DOCUMENTS

| | | | |
|---|---|---|---|
| 4,148,047 | * 4/1979 | Hendrickson | 357/23 |
| 5,307,292 | 4/1994 | Brown et al. | 364/563 |
| 5,602,046 | 2/1997 | Calafut et al. | 437/41 |
| 5,767,550 | 6/1998 | Calafut et al. | 257/355 |
| 6,028,990 | * 2/2000 | Shahani et al. | 390/500.09 |

OTHER PUBLICATIONS

Samavati et al., "Fractal Capacitors", IEEE International Solid–State Circuits Conference, Digest of Papers, 1998, pp. 2035–2041.*

Fractal Capacitors, Samavati, et al.; *IEEE Journal of Solid-State Circuits*, vol. 33, No. 12, Dec., 1998.

Surface Measurement & Analysis, *Topographical Surfaces and Fractal Analysis*; http://www.mm.com/gastaus/fractal.htm1#fractanaly (May 29, 1997).

Interfaces in Nature; *Interfaces in Nature*; http://www.cup.cam.ac.uk/onlinepus/Fractals/fracts1.html (May 29, 1997).

G.A. Stauss & Associates web site; http://www.mm.com/gastaus/; May 29, 1997.

Fractals and Scale, Green, David G., *Environmental and Information Sciences*, Charles Sturt University, Revised 1995.

Surfrax, Software for the Scale Sensitive Fractal Analysis of Topographic Data; *Surfrax Software for the Analysis of Surface Data*; http://www.mm.com/gastaus/surfrax.html, May 29, 1997.

Fractal Geometry; *The Fractal Microscope: Fractal Geometry*; http://www.ncsa.uiuc.edu/Edu/Fractal/Fgeom.html, May 29, 1998.

* cited by examiner

*Primary Examiner*—Olik Chaudhuri
*Assistant Examiner*—Kurt Eaton
(74) *Attorney, Agent, or Firm*—Pierce Atwood; Chris A. Caseiro

(57) ABSTRACT

A method for utilizing fractal analysis in the design and manufacture of semiconductor structures including transistor devices such as power MOS devices. The method includes using fractal theory to determine optimum source perimeter values to increase aspect ratio. The method is implemented to allow for use of the theoretical values in conjunction with known photolithographic fabrication techniques. The resultant structure thus incorporates the theoretically derived values to approximate a fractal structure.

9 Claims, 4 Drawing Sheets

VERY HIGH ASPECT RATIO SEMICONDUCTOR DEVICES USING FRACTAL BASED TOPOLOGIES

BACKGROUND OF THE INVENTION

1. Field of Invention

The present invention relates to the field of semiconductor devices, including the production of metal oxide semiconductor (MOS) devices. More particularly, the present invention relates to power semiconductor devices made using processes to create field effect transistor (FET) devices with optimized channel-length-to-area ratios, commonly referred to as aspect ratios. More particular yet, the present invention relates to the optimization of device layout methodology based on a mathematical construct known as fractional dimension analysis, or fractal analysis, to achieve high aspect ratios.

2. Description of Prior Art

Applications in which power semiconductor MOS field effect transistors (MOSFETs) using double-diffusion MOS (DMOS) process technology are found range from high-voltage telecommunications circuits down to 3.3 volt DC-DC converters used on personal computers. A power MOSFET is essentially a large array of unit-cell DMOS transistors with several additional elements designed to evenly distribute gating signals and to control device breakdown voltage. The resulting grouping of individual transistors on a single die reduces total ON-state resistance, or ON-resistance, when the power MOSFET is active. Lower ON-resistances yield DMOS devices having lower power dissipation and higher speed charge movement. Accordingly, DMOS technology is preferred in high voltage circuitry of today's high-power integrated circuit applications.

The structural relationships within the power MOS devices are directly related to the ultimate ON-state resistance of a given circuit. In that regard, each transistor of a grouping in a power semiconductor device has an electrical behavior that is directly proportional to its aspect ratio. The aspect ratio is defined by the relationship between a transistor's channel width (W) and its area. Hence, the aspect ratio for a given transistor topology will be a strong function of the shape chosen to implement device geometry. The aspect ratio is a function of the shape of the transistor's active area and is generally defined as the channel perimeter divided by the channel area. For example, a common power MOSFET configuration includes a hexagonally-shaped active area, as illustrated in FIG. 1. For that shape, the aspect ratio (AR) is calculated from equation (1):

$$AR = 4*h/(s+h)^2 \qquad \text{Equation (1)}$$

Of course, it is easy to see that aspect ratio values can be calculated for other unit cell shapes (i.e., squares, circles, etc.).

Maximizing aspect ratios of transistors results in an important lowering of the transistor's channel resistance, thereby contributing to a desired reduction in total transistor ON-resistance. Correspondingly, placing resistive regions of a channel in parallel so as to lower the channel's effective resistance reduces the channel resistance. Increases in this "channel paralleling" also lead to increases in transistor aspect ratios. Typically, aspect ratios for closed-cell geometries, such as the hexagon of FIG. 1, are less than one under the most advanced of existing semiconductor fabrication methods. That can easily be seen in the case where the dimensions h and s shown in FIG. 1 are equal to 1.0 μm, something that is currently not achievable for mass production power devices. If that were possible, an aspect ratio of 1 would be developed. Instead, existing fabrication methods yield transistors with aspect ratios of only about 0.3. Thus, it would be of considerable advantage in reducing ON-resistance to be able to fabricate transistors with aspect ratios of 1 or greater. In addition to faster operation and lower power drain, transistors with optimized aspect ratios provide for efficient silicon utilization.

Concurrent with the development of the field of power MOS device fabrication, there have been developments in the analysis of topographic and profile data. Some of this development has included fractional dimension analysis, or fractal analysis. Fractal analysis is borne out of the mathematical study of fractals. A fractal is a geometric shape that is complex and equally detailed in structure at any level of magnification—i.e., fractals are typically "self-similar" meaning that they have the property that each small portion of the fractal can be viewed as a reduced-scale replica of the whole. One such example of a fractal is the "Koch Curve" as shown in FIGS. 2a–2c. The Koch Curve is named after mathematician Helge Von Koch who introduced this technique in 1904.

The Koch Curve is a classic illustration of fractal development where systematic changes to a given shape are iterated to form a fractal. Such changes could be either additions to the whole or subtractions from the whole, but more importantly the changes are patterned replications. In FIG. 2a, a straight line of unit length is divisible into three equal lengths. The middle length is replaced with an equilateral triangle in FIG. 2b. This change to the whole is then replicated in FIG. 2c to result in a simple fractal. Mathematically, it should be noted that the straight line of FIG. 2a increases in length by four-thirds in FIG. 2b and increases in length again by four-thirds in FIG. 2c, or an increase of sixteen-ninths from the original straight line in FIG. 2a. Although the Koch Curve is only taken to two iterations, it becomes clear that even an initial straight line could develop into a very complex figure through multiple iterations.

An important occurrence in the study of fractals was the development of fractal geometry by the mathematician Benoit B. Mandelbrot. Fractal geometry redefined the concept of "dimension" with respect to Euclidean geometry. In fractal geometry, the dimension of a fractal must be used as an exponent when measuring its size. This means that a fractal cannot be treated as existing strictly in one, two, or any other whole-number dimension. Instead, it must be handled mathematically as though it has some fractional dimension. Theoretical in derivation, true fractal geometries are an idealization. No curve or surface in the real world is a true fractal. However, theoretical fractal geometries may be approximated in physical objects.

One prior-art method using fractal analysis in this manner to quantify the topographic structure of a surface is taught by Brown et al. (U.S. Pat. No. 5,307,292). The method of Brown et al. is a fractal-based analysis of a given structure's topography. His method simulates covering the surface of the structure with triangular patches in order to determine the relative surface area that is a function of patch size or scale of observation. The total measured area value is divided by the projected area value to obtain a relative area value. The relative values for several patch area values are plotted to obtain a slope and a threshold point. The threshold point is indicative of a point which separates the relatively large scales of observation or interaction which are best described by Euclidean geometry from those smaller ones which are best described by fractal geometry. Although the analytical method of Brown et al. appears useful in design, analysis, and manufacture of surfaces where sub-micron technologies are critical (e.g., adhesion, wear, friction, lubrication, corrosion, . . . etc.), this method is limited to just such topographical concerns.

In more relevant context, fractals may be seen to be applicable in a transistor fabrication setting for the following reason. Fractals are basically fragmented geometric shapes that can be subdivided into well-defined sub-shapes coming from the primary geometry. The advantage in this characteristic is that consistent optimization of the aspect ratio becomes possible for a given fabrication process technology. The advantage of using fractal analysis in the semiconductor field is only now being realized, as is evident from a paper written by Samavati et al. entitled "Fractal Capacitors," 1998 IEEE International Solid-State Circuits Conference, Digest of Papers. In that paper, Samavati describes the possibility of fabricating a fractal capacitor taking advantage of, in theory, infinite periphery dimensions in a finite area to significantly increase capacitance in a fixed area. While the Samavati reference explores only MOS capacitors, it provides a strong foundation to augment the current MOSFET technology. MOS devices form a critical part of power device design, and in particular, the efforts to optimize aspect ratios are related, to an extent, to that disclosed by Samavati. However, that reference is limited to the description of a relatively simple passive semiconductor device. It fails to account for the considerable processing requirements associated with active semiconductor devices, such as power MOSFETs.

Accordingly, the prior art fails to provide any structural solution (e.g., hexagonal shaping) or analytical solution (e.g., the method of Brown et al.) to increasing aspect ratios of sub-surface structures adequately for today's applications—in particular for power MOS devices. Therefore, what is needed is a fabrication process that provides unique power MOS devices with aspect ratios exceeding those available through current processing techniques. What is also needed is such a method and resultant power MOS structure that ensures an increased junction perimeter while maintaining active cell area. Further, what is needed is such a method that utilizes fractal theory to provides geometric values easily incorporated into current photolithographic fabrication of power MOS devices.

SUMMARY OF THE INVENTION

It is an object of the present invention to provide a structural solution to the need for increasing aspect ratios on conventional semiconductor structures including power MOSFET design topologies. Another object of the present invention is to provide a method that yields such a power MOS device with an increased aspect ratio. Yet another object of the present invention is to provide such a method and resultant power MOS structure that ensures an increased junction perimeter while maintaining a suitable active cell area. Still another object of the present invention is to provide a method that utilizes fractal theory to provide geometric values easily incorporated into current photolithographic fabrication of power MOS devices.

The method of the present invention and the structure produced by such method utilizes fractal-based geometries. Although this discussion focuses on use of the present invention to fabricate a power MOS device with a source perimeter determined by fractal analysis, any similar MOS structure may incorporate such fractal design methods without straying from the scope of the present invention. Such devices can be bipolar junction power transistors (BJPT), which also exhibit improved operation with optimization of the emitter periphery for reasons similar to those noted in regard to the MOSFETs. Insulated gate bipolar transistors (IGBT), gate turn-off thyristors (GTO's), and MOS-controlled thyristors (MCTs) are other power devices that may be able to benefit from the development of increased aspect ratios through fractal topology.

A key result of fractal theory is that it is possible to construct a finite area geometry with an infinite perimeter boundary. This is the fundamental concept underlying the present invention. According to the present invention, it is possible to utilize fractal analysis to determine an optimal perimeter boundary within a particular power MOS structure. However, actual boundaries may be limited by the photolithographic fabrication limitations. A MOS structure would initially be designed mathematically to determine the theoretical values that represent a fractal that would result in an optimal aspect ratio. These theoretically-derived values would then be used in the fabrication of the enhanced MOS structure. Such utilization of fractal theory is applicable to both planar and trench structures. As an example of a fairly simple fractal topology applied to the design of a power MOSFET, consider the Quadric Koch Island shown in FIGS. 3a–3c. An initiator square is taken as the baseline that defines a particular area calculated as the square of the initiator's side, as shown in FIG. 3a. A line segment shown in FIG. 3b is identified as a generator and is used to replace each side of the initiator of FIG. 3a. The replacement of the square's side with the generator is the first, albeit simple, step in developing a fractal topology to define the initiator's area. The result is a new topology shown in FIG. 3c in which the surface area of the unit originally defined by the initiator remains fixed, while the length of each side following the perimeter of the unit doubles that of the initiator. In terms of a fractal-based transistor of the present invention, each of the sides of the structure shown in FIG. 3c is the equivalent of a transistor channel width. Since the effective active area remains constant, a doubling of the effective channel width provides a significant increase in the aspect ratio. Each subsequent iteration of the fractal generator replaces each segment of the perimeter lines of the prior generator with a scaled version thereof. Other generator designs can be employed to achieve the same improvement in width-to-area ratio. Of course, calculations may be made to optimize particular geometries that are reasonable to fabricate and that increase the effective perimeter for a well-defined active area. It is also to be noted that in actual transistor formation practice it would be advantageous to round corners of those particular geometries selected so that high electric fields proximate to sharp corners are reduced. This would also reduce the aspect ratio, but optimization of the aspect ratio in association with minimizing local electric fields is soluble.

It is to be understood that other objects and advantages of the present invention will be made apparent by the following description of the drawings according to the present invention. While a preferred embodiment is disclosed, this is not intended to be limiting. Rather, the general principles set forth herein are considered to be merely illustrative of the scope of the present invention and it is to be further understood that numerous changes may be made without straying from the scope of the present invention.

BRIEF DESCRIPTION OF THE DRAWINGS

FIGS. 2a through 2c are schematics of a prior-art Koch Curve.

DETAILED DESCRIPTION OF THE PREFERRED EMBODIMENT

Figures 1, 2:
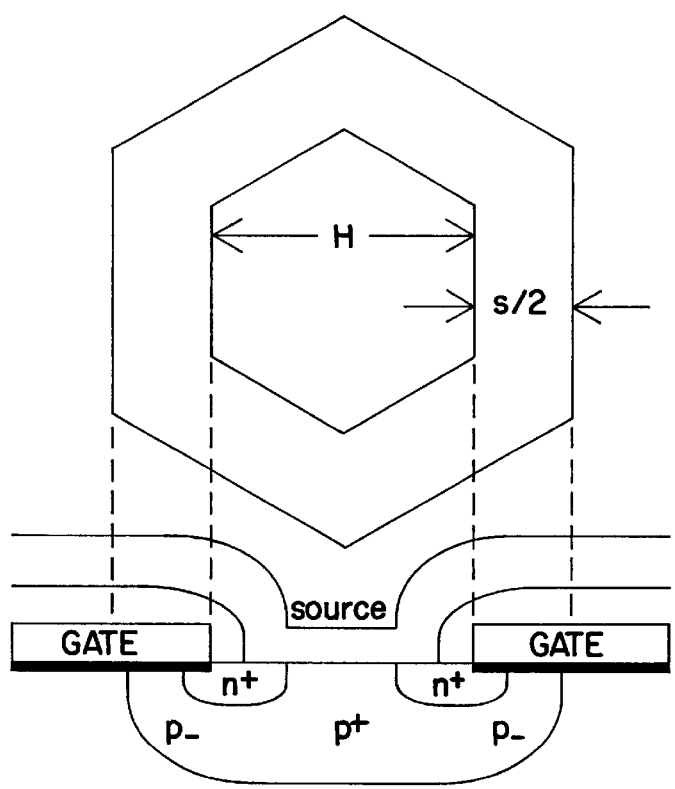
FIG. 1 is a schematic diagram of a prior-art hexagonal cell-array.
Figure 3A:
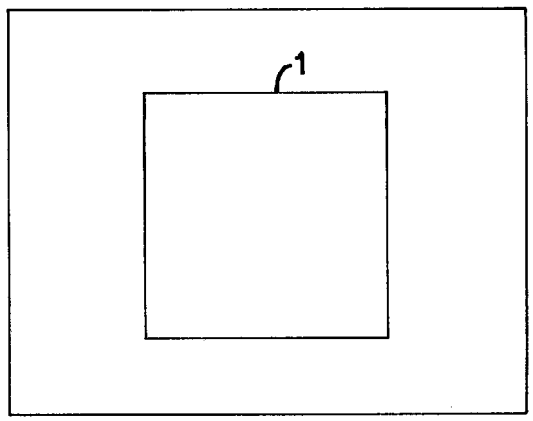
FIGS. 3a through 3c are simplified illustrations of exemplar an active area design with an initiator replaced by a set of eight-segmented generators.
Figure 3B:
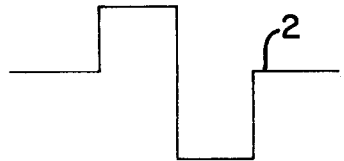
Figure 3C:
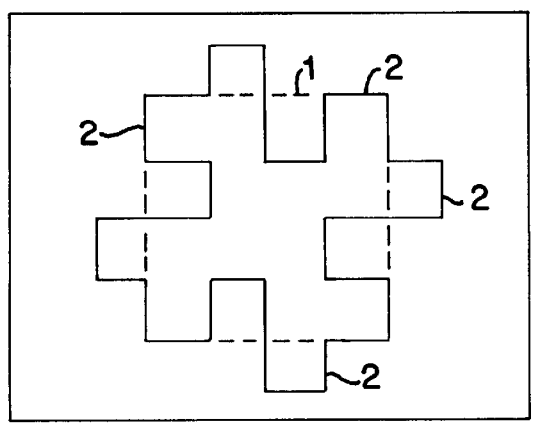
Figure 6:
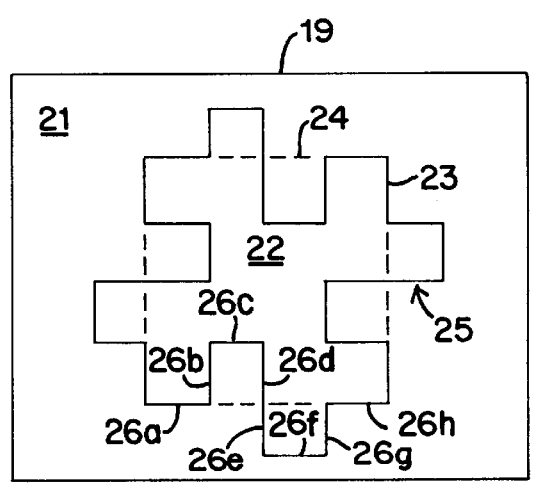
FIG. 6 is a plan view of a simplified fractal-based configuration of the gate photoresist mask of the present invention.

A transistor structure of the present invention having a fractal-based topology is formed using primary process operations and configurations as illustrated in FIGS. 4–8 for a DMOS transistor fabrication process. It is to be understood that the key feature of the present invention is the modification of standard photolithographic masks using fractal geometry methods of the type described herein in order to create mask openings in transistor active areas where transistor channels are developed. While a particular channel configuration is shown in FIG. 6 using fractal technology, it is to be understood that alternative mask openings may be employed in conformance with the present invention.

Figure 4:
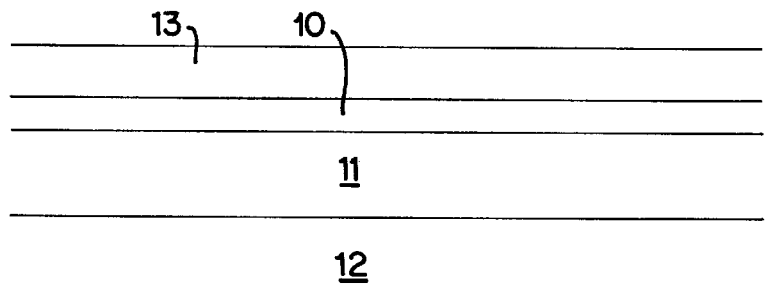
FIG. 4 is a simplified schematic diagram showing in cross section a prior-art transistor fabrication sequence showing the blanket polysilicon deposition.

FIG. 4 illustrates a prior-art initial stage of the transistor designed using the fractal topology of the present invention. Prior to the fabrication sequences used to form the transistor structure, a thin-gate oxide layer 10 is developed on a single crystal epitaxial layer 11 of N⁻ silicon that has been grown on an N+ substrate 12 of semiconductor material. A blanket layer of polycrystalline silicon (poly) 13 is chemically vapor-deposited over all structure surfaces, including what will become transistor active areas, to a depth of about 5500 Å. The poly 13 may be doped as necessary, preferably with an implant of Phosphorus atoms, to adjust the threshold voltage for the transistor structure to be created.

Figure 5:
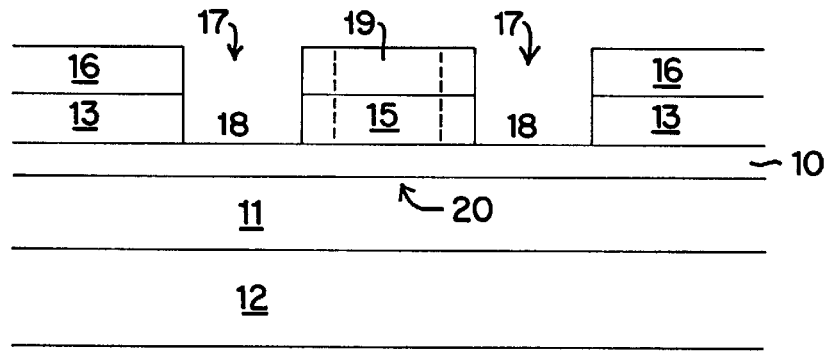
FIG. 5 is a simplified schematic diagram showing in cross section a stage in the fabrication of the transistor structure of the present invention including the new gate photoresist mask of the invention.

Referring to FIG. 5, a Poly Gate Definition Mask 14 of the present invention and corresponding steps define a poly gate 15 that is a portion of a transistor structure, such as a DMOS transistor structure. The Mask 14 includes resist regions 16 designed to block anisotropic etching of certain portions of the blanket layer 13. Mask openings 17 expose transistor active areas 18 for subsequent doping steps. Gate area mask section 19 of the Mask 14 is designed to define a fractal-based topology of a gate channel 20 of the transistor structure as illustrated in FIG. 6.

FIG. 6 shows a preferred design of the gate area mask section 19 of the present invention having an exemplar gate block configuration. The section 19 includes a section opening 21 the shape of which is defined by gate section block 22 of the Mask 14. A perimeter 23 of the section block 22 is set by modifying an original initiator 24 configuration of a standard prior-art gate definition mask by replacing each side of the standard square with a non-linear gate definition generator 25 that is preferably an oriented broken line having the same endpoints as the square's sides. The generator 25 can be of selectable configuration that may be defined by an equation such as that presented in Equation 2.

$$D = \log N / \log b \qquad \text{(Equation 2)}$$

D is a dimensionless identifier known as Richardson's D. "N" is the total number of generator segments (in the FIG. 6 example, segments 26a14 26h) that form the generator 25. Additionally, "b" is the number of linear generator segments (segments 26a, 26c, 26f, and 26h in FIG. 6) the total length of which is the equivalent to the length of a side of the square initiator 24. In order to ensure that that is no discontinuity in the design of the gate section block 22, or that there are no overlapping generators 25, it is preferable to select N and b such that the value of D remains below 2. Additionally, in order to realize the advantage of using fractal geometry to enhance transistor operation, N and b must be selected such that D is greater than 1. For the exemplar fractal topology shown in FIG. 6, with N=8 and b=4, D=3/2.

Subsequent active area doping produces under the transistor structure's gate a channel configuration that essentially matches the shape of the gate section block 22. Assuming that idealized configuration is achieved and that segments 26 have a length of 1 μm, and that the value for b is 4 μm, the aspect ratio of the transistor structure is 32/16=2. Under existing fabrication conditions, however, such accuracy cannot be achieved. Nevertheless, the use of a fractal-based gate blocking mask section provides the capability to increase channel perimeter without a corresponding increase in channel area. Thus, the aspect ratio will be less than 2 using the exemplar topology of FIG. 6, with limitations on achieving that idealized value due to the fabrication restrictions noted as well as the desire to include rounded edges at segment interfaces in order to reduce high electric fields at those sites.

Figure 7:
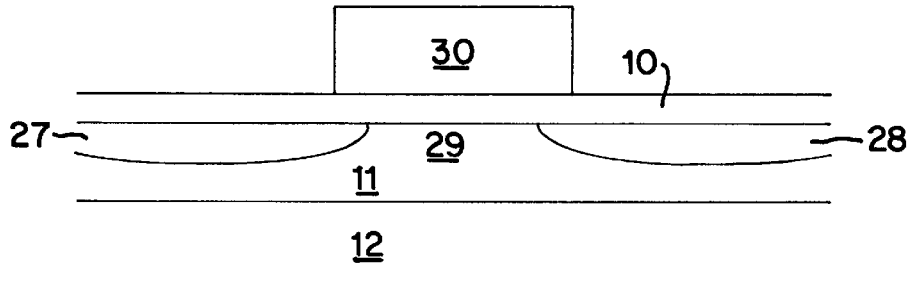
FIG. 7 is a simplified schematic diagram showing in cross section a stage in the fabrication of the transistor structure of the present invention including the new gate/channel configuration of the invention.

With continuing reference to the general steps used to fabricate the transistor structure of the present invention having a fractal-based channel topology, FIG. 7 illustrates formation of a first active region 27, a second active region 28, and a novel channel region 29 therebetween and underlying a fractal-based gate 30. The first active region 27 and the second active region 28 may be fabricated by any suitable means, preferably including the ion implantation of an impurity of first or second conductivity type and subsequent thermal drive of the impurity into the epitaxial layer 11. These steps may result in some distortion of the idealized configuration of the channel region as shown in FIG. 6 of the type that occurs in existing processes. However, the overall aspect ratio of the channel region 29 for the fractal-based structure remains well above that of existing structures. Since the substrate 12 and the epitaxial layer 11 of the structure have been defined in this described embodiment of the invention as being formed of an N-type dopant or carrier, active regions 27 and 28 would be formed of a dopant of opposite conductivity type. That is, a P-type dopant used to establish isolation wells to contain later N+ dopant regions that will define the source regions of the transistor.

Figure 8:
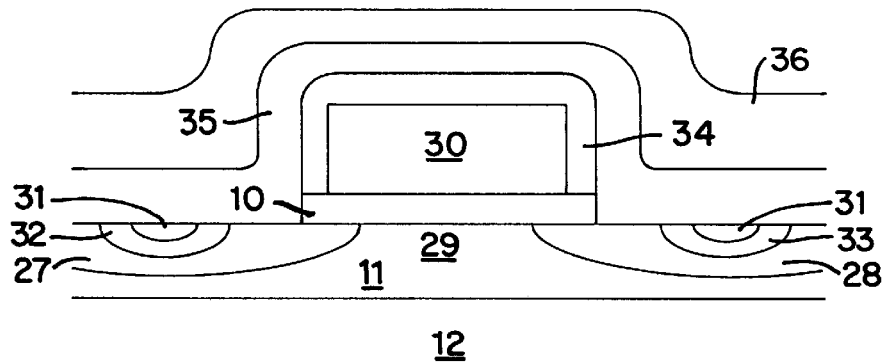
FIG. 8 is a simplified schematic diagram showing in cross section a transistor structure of the present invention.
Figure 9:
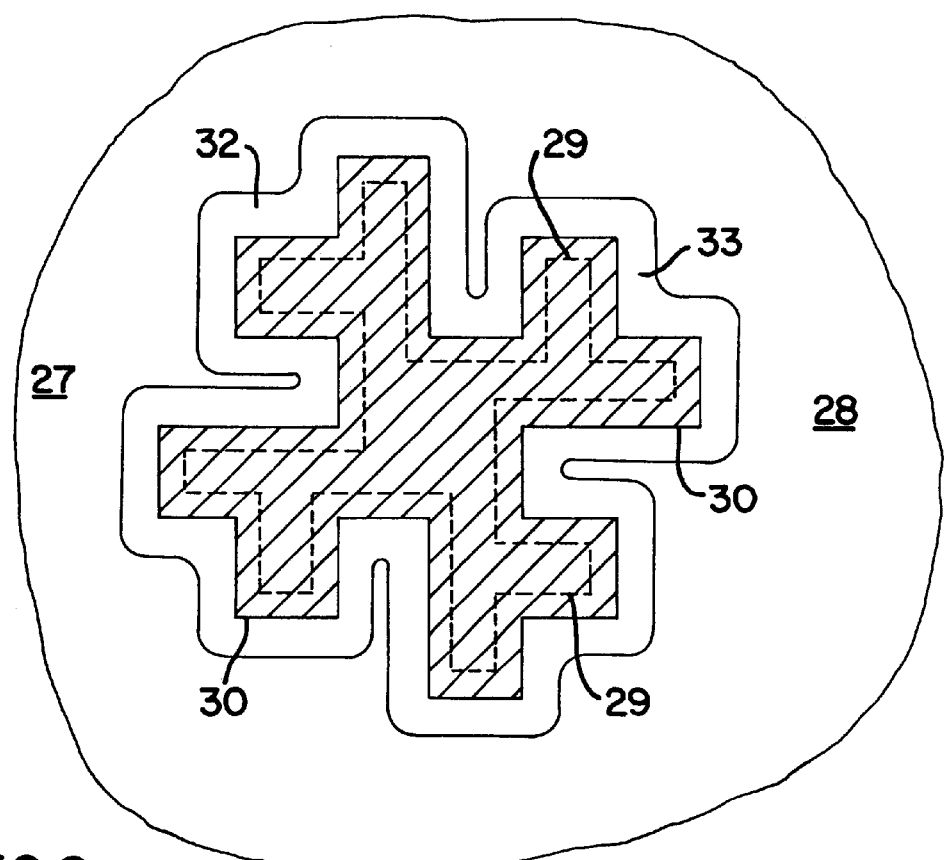
FIG. 9 is a simplified plan view of the gate and source regions of the transistor structure of the present invention shown in FIG. 8.
Figure 10:
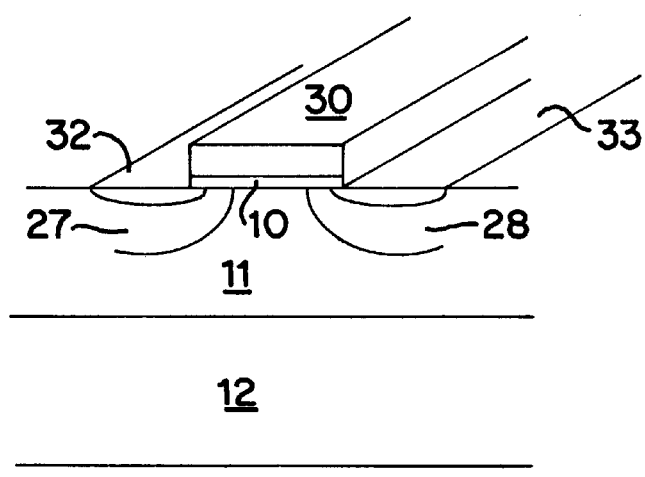
FIG. 10 is a simplified perspective view of the transistor structure of the present invention shown in FIGS. 8 and 9.

FIG. 8 illustrates a simplified completed transistor structure of the present invention having the fractal-based gate 30 and the fractal-based channel 29. Additional implant and thermal processing steps create optional body contact regions 31, as well as first active region contact 32 and second active region contact 33. First active region contact 32 and second active region contact 33 establish the source regions of the transistor structure. For the doping types described with respect to regionse 11, 12, and 27 and 28, contact regions 32 and 33 are preferably formed with an N+ dopant introduction using standard processing techniques for that purpose. The thermal operations drive impurities to move laterally and vertically in a way that further modifies the configuration of channel 29. A dielectric layer is formed in a blanket deposition step and is subsequent etched away in sections in order to leave a gate insulator region 34 to protect the gate 30. A blanket metal deposition, preferably using Aluminum, is formed on all surfaces and then etched back where required in order to isolate active structures, leaving contact metal regions 35. A passivation layer 36 is then deposited on all surfaces for final insulation of the structure. The structure shown in FIG. 8 is a MOS transistor having the fractal-based gate 30, source regions 32 and 33, and substrate 12 that is the drain of the structure, as is well known by those skilled in the art of the fabrication of DMOS transistor structures.

It should be understood that the preferred embodiment mentioned here is merely illustrative of the present invention. Numerous variations in design and use of the present invention may be contemplated in view of the following claims without straying from the intended scope and field of the invention herein disclosed. In particular, the present invention is applicable to the formation of NMOS, PMOS, CMOS and bipolar structures as well as the DMOS structures noted herein.

I claim:

1. A MOS transistor structure comprising:
   a. a substrate of semiconductor material of first conductivity type;
   b. an epitaxial layer of semiconductor material of first conductivity type on a surface of said substrate, said epitaxial layer having formed therein a first active region, a second active region, and a channel therebetween, wherein said channel is configured in a fractal-based pattern;
   c. a gate oxide layer on a surface of said epitaxial layer over said first active region, said second active region, and said channel, wherein said gate oxide layer is configured in a fractal-based pattern corresponding to said fractal-based pattern of said channel; and
   d. a gate on a surface of said gate oxide layer, wherein said gate is configured in a fractal-based pattern substantially conforming with said fractal-based pattern of said gate oxide layer.

2. The MOS transistor structure as claimed in claim 1 wherein said gate has a perimeter including three or more generators of equivalent configuration.

3. The MOS transistor structure as claimed in claim 2 wherein each of said generators is formed of eight segments of substantially equal length, wherein said eight segments form an oriented broken line.

4. The MOS transistor structure as claimed in claim 1 wherein said gate is formed of a polysilicon semiconductor material.

5. The MOS transistor structure as claimed in claim 1 wherein said first active region and said second active region are source regions and said substrate is a drain region.

6. The MOS transistor structure as claimed in claim 5 wherein said first active region, said second active region, and said substrate are formed of N-type semiconductor material.

7. The MOS transistor structure as claimed in claim 1 wherein said MOS transistor device is a DMOS power transistor.

8. The MOS transistor structure as claimed in claim 1 wherein said gate has a perimeter configured by a generator defined by the equation $D = \log N / \log b$, wherein D is a dimensionless number, N is a total number of generator segments, and b is a number of linear generator segments.

9. The MOS transistor structure as claimed in claim 8 wherein N=8 and b=4.

* * * * *